US012062400B2

(12) United States Patent
Shimada et al.

(10) Patent No.: US 12,062,400 B2
(45) Date of Patent: Aug. 13, 2024

(54) MEMORY SYSTEM AND READ METHOD

(71) Applicant: KIOXIA CORPORATION, Tokyo (JP)

(72) Inventors: Katsuyuki Shimada, Ota Tokyo (JP);
Yuki Komatsu, Kawasaki Kanagawa (JP); Shingo Yanagawa, Kawasaki Kanagawa (JP); Yasuyuki Ushijima, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 170 days.

(21) Appl. No.: 17/899,293

(22) Filed: Aug. 30, 2022

(65) Prior Publication Data

US 2023/0298672 A1    Sep. 21, 2023

(30) Foreign Application Priority Data

Mar. 16, 2022  (JP) ................................. 2022-041505

(51) Int. Cl.
| | |
|---|---|
| *G11C 11/00* | (2006.01) |
| *G11C 16/26* | (2006.01) |
| *G11C 16/34* | (2006.01) |
| *G11C 29/52* | (2006.01) |

(52) U.S. Cl.
CPC .......... *G11C 16/26* (2013.01); *G11C 16/3404* (2013.01); *G11C 29/52* (2013.01)

(58) Field of Classification Search
CPC ...... G11C 16/26; G11C 16/3404; G11C 29/52
See application file for complete search history.

(56) References Cited

U.S. PATENT DOCUMENTS

| | | | |
|---|---|---|---|
| 9,640,253 B2 | 5/2017 | Conley et al. | |
| 11,195,585 B2* | 12/2021 | Tokutomi | ............... G11C 16/26 |
| 11,373,713 B1* | 6/2022 | Zeng | .................. G11C 16/3404 |
| 2016/0314834 A1 | 10/2016 | Conley et al. | |
| 2021/0058099 A1 | 2/2021 | Kim | |
| 2021/0295943 A1 | 9/2021 | Yamaki et al. | |
| 2023/0251928 A1* | 8/2023 | Mandai | ............... G06F 11/1024 |
| | | | 714/763 |

* cited by examiner

*Primary Examiner* — Pho M Luu
(74) *Attorney, Agent, or Firm* — Kim & Stewart LLP

(57) ABSTRACT

A memory system includes a memory including nonvolatile memory cells, and a controller configured to set read voltages for reading data stored in the nonvolatile memory cells. The controller stores first shift patterns relating to a plurality of read voltages, first index information associating to a first shift pattern with each of a plurality of memory cell groups, second shift patterns relating to differences between read voltages and read voltages set according to a first shift pattern, and second index information associating a second shift pattern with each memory cell group. The controller generates read voltages of a target memory cell group based on the first shift pattern voltages and the second shift pattern voltages.

20 Claims, 10 Drawing Sheets

FIG. 6

| DEFAULT TABLE ||||||||
|---|---|---|---|---|---|---|---|
| READ VOLTAGE | VA | VB | VC | VD | VE | VF | VG |
| DEFAULT VALUE | VA0 | VB0 | VC0 | VD0 | VE0 | VF0 | VG0 |

| FIRST SHIFT TABLE ||||||||
|---|---|---|---|---|---|---|---|
| FIRST SHIFT PATTERN / FIRST INDEX | SA1 | SB1 | SC1 | SD1 | SE1 | SF1 | SG1 |
| 0 | 0 | 0 | 0 | 0 | 0 | 0 | 0 |
| 1 | 0 | 1 | -1 | -1 | 0 | 0 | 0 |
| 2 | 0 | -1 | -1 | 0 | -2 | -1 | -10 |
| 3 | 2 | -1 | -1 | 0 | -1 | 1 | -2 |
| ... | ... | ... | ... | ... | ... | ... | ... |
| 254 | 0 | -3 | -5 | -8 | -10 | -12 | -15 |
| 255 | 2 | -5 | -7 | -10 | -12 | -14 | -17 |

36b

| SECOND SHIFT TABLE | | | | | | | |
|---|---|---|---|---|---|---|---|
| SECOND SHIFT PATTERN / SECOND INDEX | SA2 | SB2 | SC2 | SD2 | SE2 | SF2 | SG2 |
| 0 | -1 | -1 | 1 | 2 | 2 | 2 | 2 |
| 1 | -1 | 0 | 3 | 1 | 2 | 2 | 2 |
| 2 | -2 | -2 | -3 | -1 | 0 | 0 | 0 |
| ... | ... | ... | ... | ... | ... | ... | ... |
| 31 | 0 | -3 | -5 | -8 | -10 | -12 | -15 |

| FIRST BLOCK MANAGEMENT TABLE | | | | | |
|---|---|---|---|---|---|
| BLOCK ADDRESS | 0 | 1 | 2 | 3 | ... |
| FIRST INDEX | 0 | 0 | 9 | 9 | ... |

| SECOND BLOCK MANAGEMENT | | | | | |
|---|---|---|---|---|---|
| BLOCK ADDRESS | 0 | 1 | 2 | 3 | ... |
| SECOND INDEX | none | 1 | 3 | 4 | ... |

36e

MEMORY SYSTEM AND READ METHOD

CROSS-REFERENCE TO RELATED APPLICATION(S)

This application is based upon and claims the benefit of priority from Japanese Patent Application No. 2022-041505, filed Mar. 16, 2022, the entire contents of which are incorporated herein by reference.

FIELD

Embodiments described herein relate generally to a memory system and a read method.

BACKGROUND

A memory system includes a memory device having a plurality of memory cells. When data are read from the memory device, a read voltage is applied to a word line connected to memory cells to be read. When the read voltage is not appropriate, many errors occur in the read data. In this case, the latency increases for executing an error correction or a retry, which deteriorates the read performance.

BRIEF DESCRIPTION OF THE DRAWINGS

FIG. 6 is a diagram illustrating an example of a default table.

FIG. 7 is a diagram illustrating an example of a first shift table.

FIG. 10 is a diagram illustrating an example of a first block management table.

FIG. 11 is a diagram illustrating an example of a second block management table.

DETAILED DESCRIPTION

Figure 1:
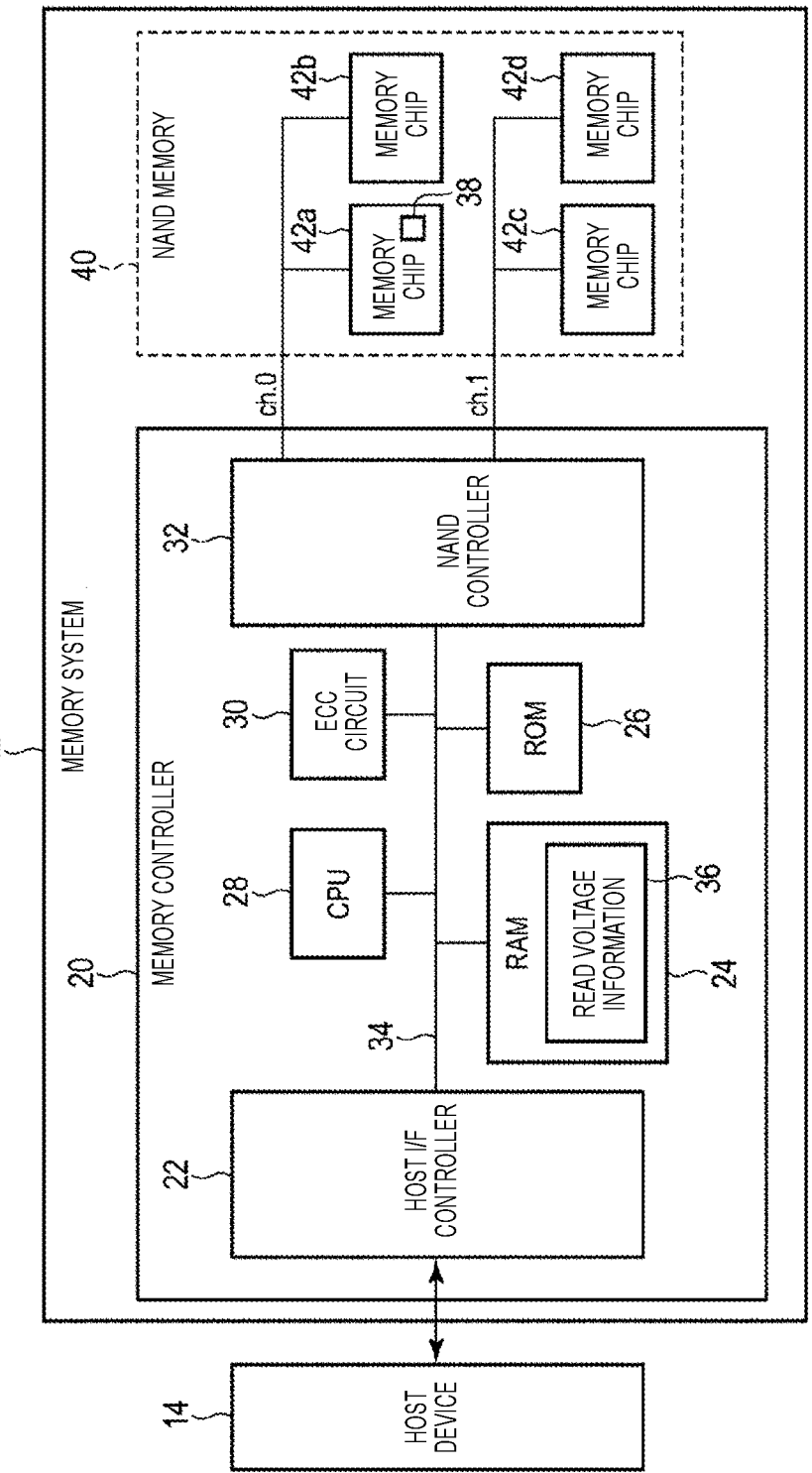
FIG. 1 is a block diagram illustrating an example of a memory system according to a first embodiment.

Embodiments provide a memory system and a read method capable of improving a read performance.

In general, according to one embodiment, a memory system has a plurality of nonvolatile memory cells, each capable of storing data, and a controller. The controller is configured to set a read voltage for reading the data stored in the plurality of nonvolatile memory cells. Each of the plurality of nonvolatile memory cells belongs to one of a plurality of memory cell groups. The controller is configured to manage: a plurality of first shift patterns for values of a plurality of read voltages, first index information associating one first shift pattern among the plurality of first shift patterns to each memory cell group among the plurality of memory cell groups, a plurality of second shift patterns for difference values indicating a difference between the values of the plurality of read voltages and values of a plurality of first read voltages set according to a first shift pattern, and second index information associating one second shift pattern among the plurality of second shift patterns to each memory cell group among the plurality of memory cell groups. The total number of the second shift patterns is smaller than the total number of the first shift patterns. The controller is further configured to: select one first shift pattern from the plurality of first shift patterns based on the first index information for a read target memory cell group among the plurality of memory cell groups, select one second shift pattern from the plurality of second shift patterns based on the second index information for the read target memory cell group, and generate read voltages for the read target memory cell group based on the selected first shift pattern and the selected second shift pattern.

Hereinafter, certain example embodiments will be described with reference to the accompanying drawings. The descriptions herein concern devices or methods embodying the certain technical concepts of the present disclosure, and the technical concepts of the present disclosure are not limited to the structures, shapes, arrangements, materials and others of components of the specific examples described. The scope of the present disclosure includes such modifications as apparent to those ordinary skilled in the art.

In order to simplify the descriptions, the drawings may schematically illustrate the size, thickness, plane dimension, shape and the like of each component. Such aspects as depicted in the drawings may be different from those of an actual implementation of an embodiment. The different drawings may depict components with different dimensional relationships or ratios. In the different drawings, the corresponding components will be denoted by the same reference symbols, and overlapping descriptions thereof may be omitted. While some components may be given multiple names, the provided names are merely examples, and the components may be given other names in other contexts. Likewise, components which are not given multiple names may have other names than those given in the description.

First Embodiment

FIG. 1 is a block diagram illustrating an example of a memory system 12 according to a first embodiment. The memory system 12 is connected to a host device 14 via a cable, a connector, a socket or a network. The memory system 12 may be provided on a printed wiring board of the host device 14. The host device 14 is an information processing device configured to control the memory system 12. The host device 14 is, for example, a server device, a personal computer, an in-vehicle device, a mobile-type information processing device, or the like. The host device 14 may issue an access request for accessing the memory system 12. The access request includes a reading request (also referred to as a read request) and a writing request (also referred to as a write request). In the descriptions herein, a reading may also be referred to as a read and a writing may also be referred to as a write.

The memory system 12 includes a memory controller 20 and a NAND type flash memory 40 (hereinafter, referred to as a NAND memory 40). The memory system 12 is, for example, an SSD (solid-state drive) or UFS (universal flash storage) device. The NAND memory 40 is an example of a nonvolatile memory. Instead of the NAND memory 40, other nonvolatile memories may be used. Examples of other volatile memories include an NOR type flash memory, MRAM (magneto-resistive random access memory), PRAM (phase change random access memory), ReRAM (resistive random access memory), and FeRAM (ferroelectric random access memory).

The memory controller 20 includes a host device interface controller 22 (host device I/F controller 24), a random access memory (RAM) 24, a read only memory (ROM) 26, a central processing unit (CPU) 28, and an error correcting code (ECC) circuit, and a NAND controller 32. The host device I/F controller 22, the RAM 24, the ROM 26, the CPU 28, the ECC circuit 30, and the NAND controller 32 are connected to a bus 34. The memory controller 20 may be configured as a system on a chip (SoC) in which the components described above are integrated into one chip. In other examples, some of these components may be provided outside the memory controller 20.

The host device I/F controller 22 executes a control of a communication interface between the host device 14 and the memory system 12 and a control of a data transfer between the host device 14 and the RAM 24, under the control of the CPU 28. Examples of the communication interface between the host device 14 and the memory system 12 include SCSI (small computer system interface), SAS (serial attached SCSI), ATA (at attachment), SATA (serial ATA), PCIe® (PCI Express®), Ethernet, Fibre channel, NVMe® (NVM Express®), USB (Universal Serial Bus), and UART (Universal Asynchronous Receiver/Transmitter).

Examples of the RAM 24 include a DRAM (dynamic random access memory) and an SRAM (static random access memory), but are not limited thereto.

The RAM 24 functions as a buffer for the data transfer between the host device 14 and the NAND memory 40. The RAM 24 provides the CPU 28 with a work area. A firmware (program) stored in the ROM 26 is loaded into the RAM 24 when the memory system 12 operates.

In the present embodiment, when the memory system 12 operates, read voltage information 38 is read from the NAND memory 40 and then stored as read voltage information 36 in the RAM 24. The read voltage information 36 relates to read voltages for the read from the NAND memory 40. When the power of the memory system 12 is turned OFF, the read voltage information 36 is stored as the read voltage information 38 in the NAND memory 40 and is not lost.

The CPU 28 is an example of a hardware processor. The CPU 28 controls the memory controller 20 by executing the firmware loaded into the RAM 24. The CPU 28 controls the write, the read, and an erase of data. A plurality of CPUs 28 may be provided for each operation.

The ECC circuit 30 executes an encoding for an error correction for data (write data) to be written to the NAND memory 40. When data read (read data) from the NAND memory 40 includes an error, the ECC circuit 30 executes the error correction for the read data, based on an error correction code given at the time of writing (the write time).

The NAND controller 32 executes a control of a data transfer between the RAM 24 and the NAND memory 40 under the control of the CPU 28. Examples of the data transfer between the NAND controller 32 and the NAND memory 40 include toggle DDR and ONFI (open NAND flash interface).

The memory controller 20 and the NAND memory 40 are connected by a plurality of channels, for example, two channels Ch0 and Ch1. Without being limited to a plurality of channels, the number of channels may be just one in some examples. Further, when the plurality of channels are provided, the number of channels may be three or more. The NAND controller 32 controls the data transfer via the channels Ch0 and Ch1.

The NAND memory 40 include a plurality of memory chips, for example, four memory chips 42a, 42b, 42c, and 42d. Here, the two memory chips 42a and 42b are connected to the channel Ch0, and the two memory chips 42c and 42d are connected to the channel Ch1. Three or more memory chips may be connected to each channel in other examples.

Figure 2:
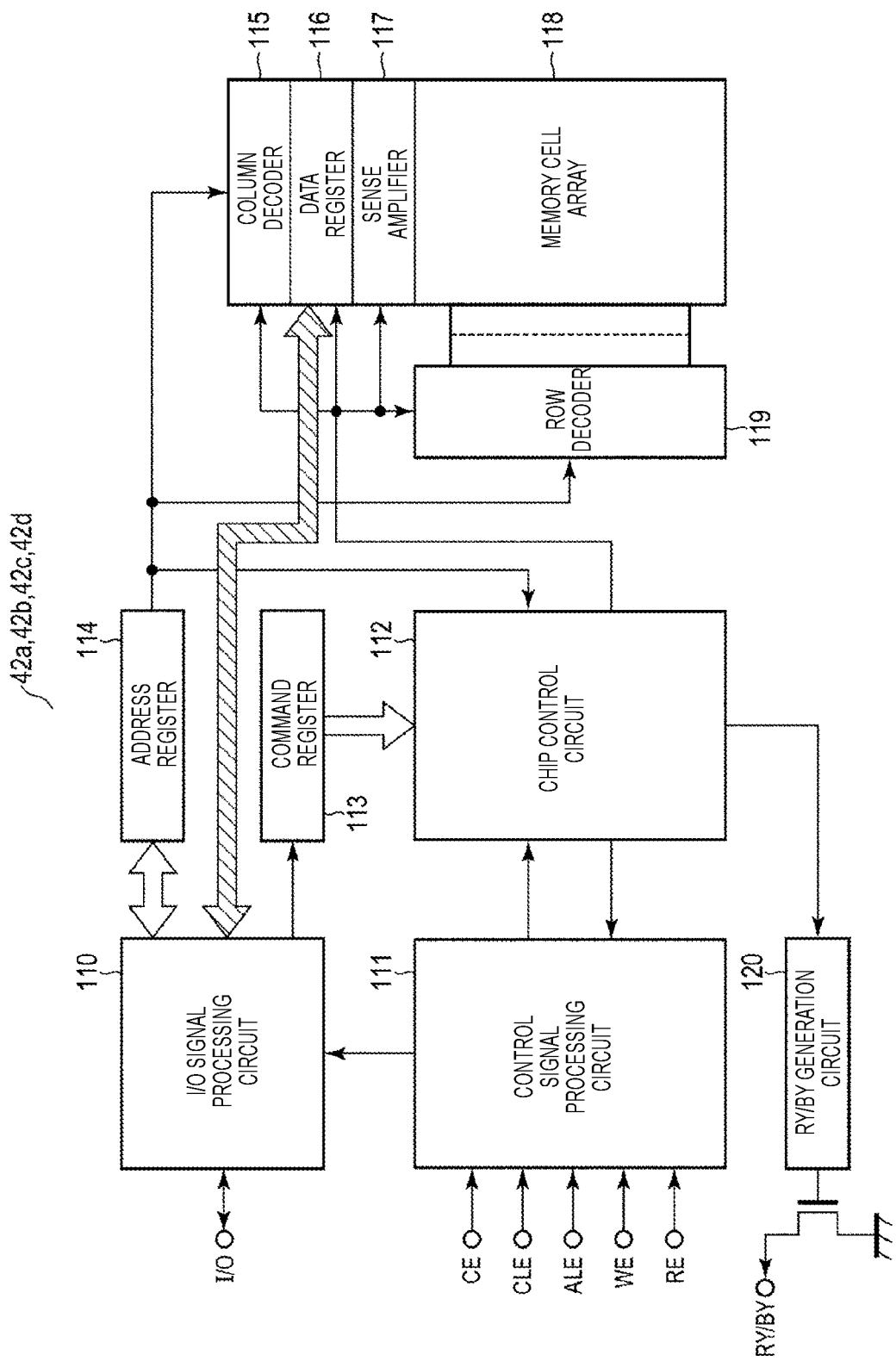
FIG. 2 is a block diagram illustrating an example of a memory chip of a memory system.

FIG. 2 is a block diagram illustrating an example of the memory chip 42a. The other memory chips 42b, 42c, and 42d are similarly configured.

The memory chip 42a includes an input/output signal processing circuit 110 (I/O signal processing circuit 110), a control signal processing circuit 111, a chip control circuit 112, a command register 113, an address register 114, a ready/busy (RY/BY) circuit 120, a memory cell array 118, a column decoder 115, a data register 116, a sense amplifier 117, and a row decoder 119.

The channel Ch0 connecting the memory chip 42a and the NAND controller 32 includes an input/output (I/O) signal line, a control signal line, and a ready/busy (RY/BY) signal line. The I/O signal line is connected to the I/O signal processing circuit 110. The I/O signal line transfers data, addresses, various instructions, and various responses. The memory controller 20 transmits a reading instruction (also referred to as a read instruction), a writing instruction (also referred to as a write instruction), and an erasing instruction to the memory chip 42a via the I/O signal line.

The control signal line includes a chip enable (CE) signal line, a command latch enable (CLE) signal line, an address latch enable (ALE) signal line, a write enable (WE) signal line, a read enable (RE) signal line and others. The control signal line is connected to the control signal processing circuit 111. The CE signal line transfers a signal indicating whether a target memory chip is selected. The CLE signal line transfers a signal indicating that a signal transferred using the I/O signal line is a command. The ALE signal line transfers a signal indicating that a signal transferred using the I/O signal line is an address. The WE signal line transfers a signal for introducing a signal of the I/O signal line into the memory chip 42a. The RE signal line transfers a signal for outputting a signal from the memory chip 42a to the I/O signal line.

The RY/BY signal line is connected to the RY/BY generation circuit 120. The RY/BY signal line transfers a signal indicating whether the NAND memory 40 is presently operating. For example, the signal transferred in the RY/BY signal line indicates a ready state (RY) that corresponds to a non-operation state at a logical value H level, and a busy state (BY) that corresponds to an operation state at a logical value L level.

The I/O signal processing circuit 110 is a buffer circuit for transmitting and receiving an I/O signal between the memory chip 42a and the NAND controller 32. A command latched by the I/O signal processing circuit 110 is distributed and stored in the command register 113. An address that specifies an access destination latched by the I/O signal processing circuit 110 is distributed and stored in the address register 114. Data latched by the I/O signal processing circuit 110 are distributed and stored in the data register 116. The I/O signal processing circuit 110 receives data from the data register 116.

The address stored in the address register 114 includes a chip number, a row address, and a column address. The chip number is identification information for distinguishing the memory chip 42a from the other memory chips. The chip number, the row address, and the column address are read by the chip control circuit 112, the row decoder 119, and the column decoder 115.

The control signal processing circuit 111 receives a control signal, and distributes a register for a storage destination of the I/O signal received by the I/O signal processing circuit 110, based on the received control signal. Furthermore, the control signal processing circuit 111 transfers the received control signal to the chip control circuit 112.

The chip control circuit 112 executes a state shift based on various control signals received via the control signal processing circuit 111. The chip control circuit 112 controls the operations of the memory chip 42a. The RY/BY generation circuit 120 shifts the state of a signal transferred in the RY/BY signal line between the ready state (RY) and the busy state (BY) under the control of the chip control circuit 112.

The sense amplifier 117 senses the state of memory cells MT (see FIG. 3) of the memory cell array 118, and generates the read data based on the sensed state of the memory cells MT, during a read. The sense amplifier 117 stores the generated read data in the data register 116. The read data stored in the data register 116 is sent to the I/O signal processing circuit 110 through a data line and transferred from the I/O signal processing circuit 110 to the memory controller 20.

The memory cell array 118 includes a plurality of memory cells MT for storing data. The memory cell array 118 includes a plurality of physical blocks BLK (see FIG. 3). Each physical block BLK is a memory cell group including a plurality of memory cells MT. The physical block BLK is the smallest unit of data erase. That is, all of data stored in one physical block BLK are collectively erased in the same erase operation. In the following, the physical blocks may be simply referred to as blocks.

Figure 3:
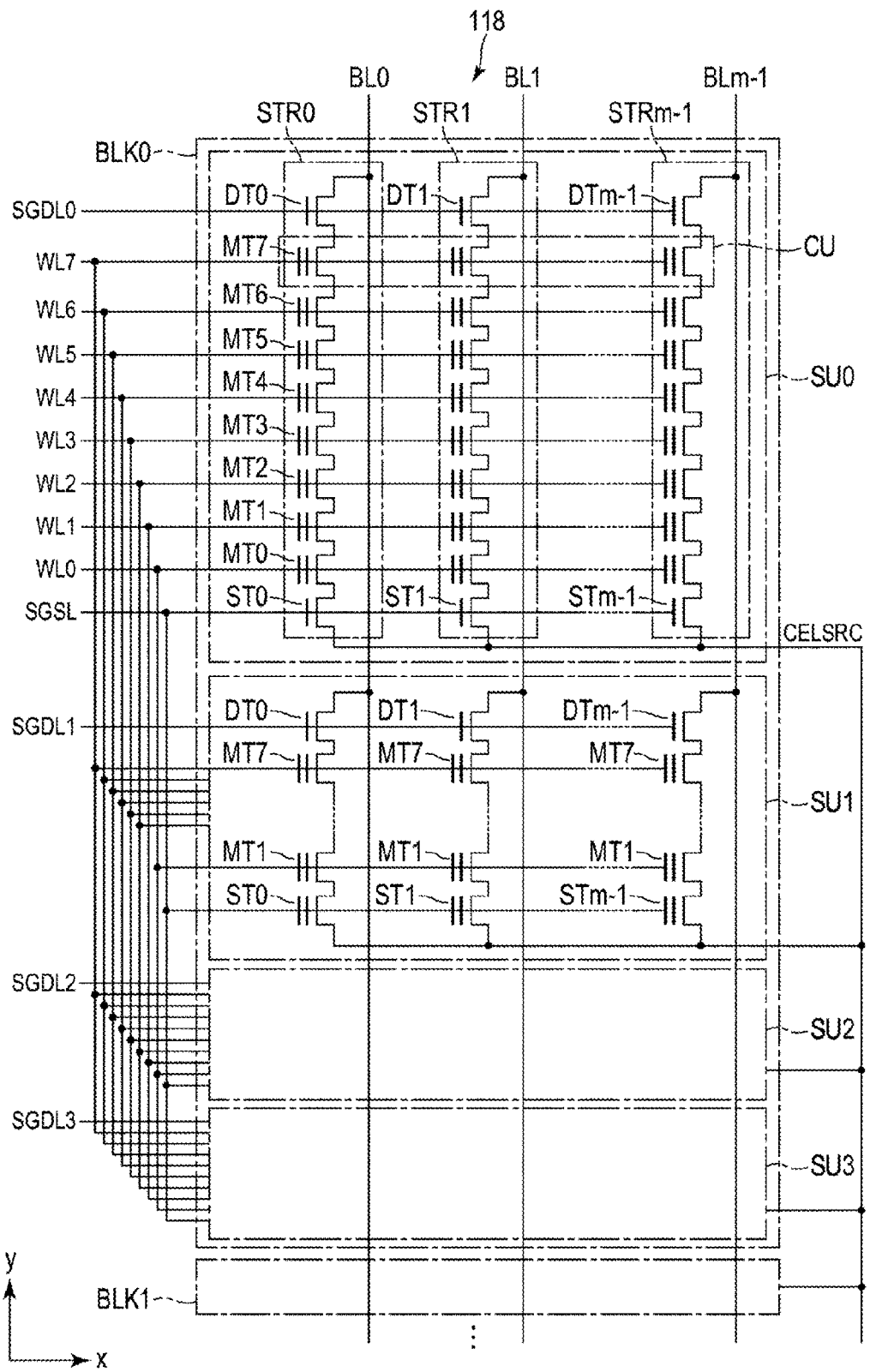
FIG. 3 is a circuit diagram illustrating an example of a memory cell array of a memory chip.

FIG. 3 is a circuit diagram illustrating an example of the memory cell array 118. The memory cell array 118 includes a plurality of blocks BLK0, BLK1, etc. In general, the memory cell array 118 includes hundreds to thousands of blocks BLK. The memory cell array 118 is, for example, a NAND memory having a so-called three-dimensional structure in which the plurality of memory cells MT are arranged in a three-dimensional manner. The structure of the NAND memory is not limited to the three-dimensional structure. The memory cell array 118 may be a NAND memory having a so-called two-dimensional structure in which the plurality of memory cells MT are arranged on a plane.

As illustrated in FIG. 3, a total of "m" bit lines (BL0 to BLm−1) are connected to strings STR in each of the blocks BLK0, BLK1, etc. Here, "m" is an integer of 2 or more. Each string STR includes one first select gate transistor ST (ST0, ST1 . . . or STm−1), a plurality of memory cells MT (MT0 to MT7), and one second select gate transistor DT (DT0, DT1 . . . or DTm−1). The first select gate transistor ST0 (or ST1 . . . STm−1), the plurality of memory cells MT0 to MT7, and the one second select gate transistor DT0 (or DT1 . . . DTm−1) are connected in this order in series between a source line CELSRC and one bit line BL0 (or BL1 . . . BLm−1). The total of "m" strings (STR0 to STRm−1) are respectively connected to the different bit lines BL0 to BLm−1. A group of "m" strings (STR0 to STRm−1) connected to a common second select gate line SGDL (drain-side select gate line) makes up one string unit SU. Each of the blocks BLK0, BLK1, etc. includes a plurality of string units, for example, four string units SU0 to SU3. Word lines WL0 to WL7 and a first select gate line SGSL (source-side select gate line) are connected in common to each of the string units SU0 to SU3.

The control gate electrodes of the first select gate transistors ST0 to STm−1 are connected to the first select gate line SGSL (source-side select gate line). The first select gate line SGSL is a signal line that controls the control gate electrodes of the first select gate transistors ST0 to STm−1. The first select gate transistors ST0 to STm−1 selectively connect the plurality of memory cells MT0 to MT7 and the source line CELSRC, based on a voltage applied through the first select gate line SGSL. In some examples, four different first select gate lines SGSL may be respectively connected to the string units SU0 to SU3.

The control gate electrodes of the second select gate transistors DT0 to DTm−1 are connected to second select gate lines SGDL0 to SGDL3 (drain-side select gate lines), respectively. The second select gate lines SGDL0 to SDGL3 are signal lines for controlling the control gate electrodes of the second select gate transistors DT0 to DTm−1, respectively. The second select gate transistors DT0 to DTm−1 selectively connect the plurality of memory cells MT0 to MT7 and the bit lines BL0 to BLm−1, respectively, based on voltages applied through the second select gate lines SGDL0 to SGDL3, respectively.

Each memory cell MT is configured as an MOSFET (metal oxide semiconductor field effect transistor) having a stacked gate structure. The stacked gate structure includes a floating gate formed via a tunnel oxide film, and a control gate electrode formed on the floating gate via a gate insulating film. A threshold voltage of the memory cell MT changes according to the number of charges stored in the floating gate. In the memory cell MT, positive charges are injected into the floating gate during a write, and the positive charges are extracted from the floating gate during an erase. In the memory cell MT, either one of two or more data values may be written. The memory cell MT stores one of two or more data values according to a difference of the threshold voltage, in a nonvolatile manner.

In each of the blocks BLK0, BLK1, etc., the control gate electrodes of the memory cells MT0 to MT7 are connected to the corresponding word lines WL0 to WL7. The word lines WL0 to WL7 are control signal lines for selecting the memory cells MT of one row which are arranged in the X direction in the memory cell array 118. Each of the word lines WL0 to WL7 is commonly connected to a group of the memory cells MT arranged in one row. The memory cells MT0 to MT7 are provided at the intersections of the word lines WL0 to WL7 and the bit lines BL0 to BLm−1. By applying a read voltage or a write voltage to a word line WL connected to memory cells MT being subjected to a read or write (hereinafter, also referred to as a selected word line WL), the read or write with respect to the memory cells MT may be executed.

In each of the blocks BLK0, BLK1, etc., the word lines WL0 to WL7 corresponding to the same address are connected to the memory cells MT0 to MT7 of each of the four string units SU0 to SU3. A set of a plurality of memory cells MT that share one word line WL in one string unit SU may also be referred to as a cell unit CU. Data are collectively written to or read from the memory cells MT in a cell unit CU. The storage space of one cell unit CU corresponds to one or more pages of data.

In the memory system 12, each memory cell MT may be configured to be capable of storing a single bit value or a plurality of bit values. When each memory cell MT is capable of storing an n-bit value, the storage capacity per word line WL is equal to a size corresponding to "n" pages. Here, "n" is an integer of 1 or more. As an example, a case where the memory cell MT operates in a triple-level cell (TLC) mode for storing a 3-bit value will be described. An operation mode in which the memory cell MT stores a 1-bit value will be referred to as a single-level cell (SLC) mode, an operation mode in which the memory cell MT stores a 2-bit value will be referred to as a multi-level cell (MLC) mode, and an operation mode in which the memory cell MT stores a 4-bit value will be referred to as a quad-level cell (QLC) mode. The present embodiment may also be applied to an operation mode in which the memory cell MT stores a value of 5 bits or more.

In the TLC mode, data corresponding to three pages may be stored in one cell unit CU. Of the three pages of one cell unit CU, a page to be written first will be referred to as a lower page, a page to be written after the lower page will be referred to as a middle page, and a page to be written after the middle page will be referred to as an upper page. Further, there may be a mode in which a program (i.e., write) is executed collectively for a part or all of a plurality of pages configured with one cell unit CU.

Figure 4:
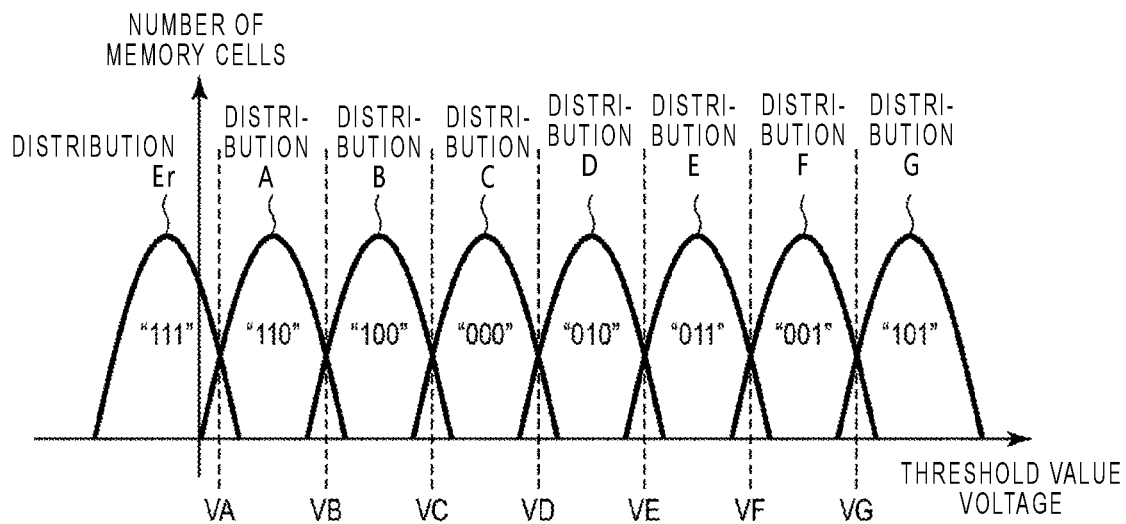
FIG. 4 is a diagram illustrating an example of threshold voltage distributions of a memory cell operating in a TLC mode.

FIG. 4 is a diagram illustrating an example of threshold voltage distributions of the memory cell MT operating in the TLC mode. In FIG. 4, the horizontal axis represents a threshold voltage of the memory cell MT, and the vertical axis represents the number of memory cells MT indicating a certain bit value (data value). The threshold voltage of the memory cell MT has a value corresponding to stored data. When the memory cell MT operates in the TLC mode, the threshold voltage of the memory cell MT includes eight distributions Er, A, B, C, D, E, F, and G as illustrated in FIG. 4.

According to the TLC mode, the memory cell MT may store 8-value data "xyz" defined by data "x" belonging to the upper page, data "y" belonging to the middle page, and data "z" belonging to the lower page. The individual values of the data x, y, and z are "0" or "1".

The threshold voltage of the memory cell MT can be controlled to belong to any of the eight distributions Er, A, B, C, D, E, F, and G. The correspondence between the respective distributions and the data values of the 8-value data xyz is predetermined. For example, the distribution Er is assigned to a data value "111". The distribution A is assigned to a data value "110". The distributions B to G are assigned to the respective data values illustrated in FIG. 4. The correspondence between the respective distributions and the data values is not limited to that described above and other examples may adopt other coding protocols or the like.

The row decoder 119, the column decoder 115, the data register 116, and the sense amplifier 117 of the NAND memory 40 will be supplementarily described also using FIG. 2. The row decoder 119, the column decoder 115, the data register 116, and the sense amplifier 117 are a part of peripheral circuits for the memory cell array 118. The peripheral circuits execute an access for a read, write, and erase to the memory cell array 118 under the control by the chip control circuit 112.

For a write, the column decoder 115 selects and activates a bit line BL corresponding to a column address. The sense amplifier 117 sets the electric potential of the bit line BL selected by the column decoder 115 to 0 volt. The row decoder 119 applies a programming pulse to a word line WL selected in association with a row address. An example of the programming pulse is a pulse in which the voltage gradually increases for each cycle. As a result, charges are injected into the floating gate of the memory cell MT located at the intersection of the selected bit line BL and the selected word line WL, and as a result, the threshold voltage of the floating gate increases. The sense amplifier 117 checks whether the threshold voltage of the memory cell MT of the write target reaches the voltage corresponding to the data stored in the data register 116, after each cycle of the programming pulse. According to the result of the checking by the sense amplifier 117, the row decoder 119 continues to apply the programming pulse, until the threshold voltage of the memory cell MT reaches the voltage corresponding to the data value to be written.

For a read, the sense amplifier 117 precharges a power supply voltage Vcc to the bit line BL. The row decoder 119 sequentially applies a plurality of read voltages VA, VB, VC, VD, VE, VF, and VG for specifying the distributions of the respective data values "111", "110", "100", "000", "010", "011", "001", and "101" to the selected word line WL. The values of the respective read voltages are voltage values at which the number of error bits of read data becomes less than the number of error bits correctable by the ECC circuit 30, and thus, no read error occurs (also referred to as appropriate values). The appropriate values depend on the threshold voltage of the memory cell MT of the NAND memory 40. Before the shipment of the memory system 12, the threshold voltage of the memory cell MT of the NAND memory 40 may be examined, and appropriate values corresponding to the threshold voltage are set as predetermined values (also referred to as default values) for the read voltages. The default values are included in the read voltage information 36. The memory controller 20 delivers the default values to the NAND memory 40, and causes the NAND memory 40 to generate appropriate read voltages. The read voltage values are represented in a conversion unit (DAC) of a D/A converter of the peripheral circuits. The DAC is a unit of an installation value of a circuit inside the NAND memory 40 that sets an application voltage of the D/A converter. The D/A converter converts a digital voltage value transmitted from the memory controller 20 into an analog voltage.

Further, the row decoder 119 applies a voltage of a transfer electric potential to a non-selected word line WL to bring the memory cells MT belonging to the non-selected word line WL into a conductive state. The sense amplifier 117 identifies data values stored in a target memory cell MT by detecting a read voltage which is applied when charges accumulated by the precharge flow out to the source line CELSRC. A memory cell MT having a threshold voltage equal to or higher than the read voltage is kept OFF even when the control gate electrode thereof receives the read voltage. A memory cell MT having a threshold voltage lower than the read voltage is turned ON when the control gate electrode thereof receives the read voltage.

As illustrated in FIG. 4, a memory cell MT having a threshold voltage lower than the read voltage VA between the distributions Er and A is determined to be included in the distribution Er. Similarly, a memory cell MT having a threshold voltage lower than the read voltage VB between the distributions A and B is determined to be included in the distribution Er or A. As illustrated in FIG. 4, a memory cell MT having a threshold voltage lower than a read voltage between two adjacent distributions is determined to be included in one of the two distributions that has the lower threshold voltage.

The threshold voltage of the memory cells MT changes due to the influence of stresses such as a program disturb, a read disturb, a data retention time or the like.

When the threshold voltage changes, appropriate values (also referred to as setting values VAs, VBs, VCs, VDs, VEs, VFs, and VGs) for the read voltages (VA, VB, VC, VD, VE, VF, and VG) also change. Thus, when a read is executed with the read voltages VA to VG at the default values VA0, VB0, VC0, VD0, VE0, VF0, and VG0 set as the appropriate values VAs, VBs, VCs, VDs, VEs, VFs, and VGs according to the threshold voltage distributions examined before the shipment, the number of error bits (fail bit count: FBC) of data increases. The vectors based on the appropriate values VAs to VGs will be referred to as appropriate value patterns. The vectors based on the default values VA0 to VG0 will be referred to as default value patterns. When the FBC is equal to or more than the number of error bits correctable by the ECC circuit 30, the memory controller 20 detects a read error. When the read error is detected, the memory controller 20 instructs the NAND memory 40 to shift the read voltage values and execute a retry read. The memory controller 20 instructs the NAND memory 40 to execute the retry read until no read error is detected. When the FBC is large, the latency increases for executing the error correction or the retry read, and thus, the read performance is deteriorated.

When a read error is detected even after the retry read is executed a predetermined number of times, the read is regarded as being failed, and an error processing is executed.

The memory controller 20 manages the default values VA0 to VG0, and further, manages first differences SA1 (SA1=VAs−VA0), SB1 (SB1=VBs−VB0), SC1 (SC1=VCs−VC0), SD1 (SD1=VDs−VD0), SE1 (SE1=VEs−VE0), SF1 (SF1=VFs−VF0), and SG1 (SG1=VGs−VG0) between the appropriate values VAs to VGs that may have changed corresponding to the change of the threshold voltage, and the default values VA0 to VG0, for the respective read voltages VA to VG.

When the appropriate values VAs to VGs change in a positive direction from the default values VA0 to VG0, the first differences SA1 to SG1 become positive values. When the appropriate values VAs to VGs change in a negative direction from the default values VA0 to VG0, the first differences SA1 to SG1 become negative values. The first differences SA1 to SG1 indicate how much the default values VA0 to VG0 need to be shifted to reach the appropriate values VAs to VGs, and will also be referred to as first shift values. The vectors based on the first shift values SA1 to SG1 will be referred to first shift patterns.

The sums of the default values VA0 to VG0 and the first shift values SA1 to SG1 equal the appropriate values VAs to VGs. When the first shift values SA1 to SG1 are SA1 (SA1=VA0−VAs) to SG1 (SG1=VG0−VGs) which are different from the definition described above, the appropriate values VAs to VGs are the differences ((VA0−SA1) to (VG0−SG1)) between the default values VA0 to VG0 and the first shift values SA1 to SG1.

The first shift values SA1 to SG1 are information used for obtaining the appropriate values VAs to VGs, and information related to the read voltages. Managing the default values VA0 to VG0 and the first shift values SA1 to SG1 specifically indicates storing the default values VA0 to VG0 and the first shift values SA1 to SG1 as the read voltage information 36 in the RAM 24 or as the read voltage information 38 in the NAND memory 40.

The memory controller 20 transmits first read voltage values VA1 (VA1=VA0+SA1), VB1 (VB1=VB0+SB1), VC1 (VC1=VC0+SC1), VD1 (VD1=VD0+SD1), VE1 (VE1=VE0+SE1), VF1 (VF1=VF0+SF1), and VG1 (VG1=VG0+SG1), which are the sums of the default values VA0 to VG0 and the first shift values SA1 to SG1, to the NAND memory 40. The NAND memory 40 generates the read voltages VA to VG corresponding to the first read voltage values VA1 to VG1, and applies the generated read voltages to the memory cell MT.

Since the threshold voltage of the memory cell MT differs for each cell, the first shift values SA1 to SG1 also differ for each memory cell MT. When the first shift values SA1 to SG1 are managed for each memory cell MT, the amount of data required to be tracked becomes enormous. Thus, the memory controller 20 may manage the first shift values SA1 to SG1 for a plurality or group of memory cells MT as a collective, rather than for each memory cell MT individual. One example of a plurality or group of memory cell MTs for as management unit for this purpose can be a block. The first shift values SA1 to SG1 may differ for each word line even within the same block. However, the difference in first shift values SA1 to SG1 for each word line may be corrected by a statistical method. In the embodiment, the memory controller 20 manages the first shift values SA1 to SG1 for each block (That is, the memory controller 20 manages the first shift values SA1 to SG1 on a per block basis).

In the NAND memory of the TLC, there are seven read voltages VA to VG, and thus, when each of the first shift values SA1 to SG1 of the read voltages VA to VG is represented by 1 byte, the first shift values SA1 to SG1 per block are amounts to 7 bytes of data. One memory chip may include thousands of blocks. The NAND memory 40 may further include a large number of memory chips. Thus, the read voltage information 36 including the first shift values SA1 to SG1 for all of the blocks of the NAND memory 40 may become rather large in size.

In the embodiment, in order to reduce the size of the memory required to store the values of the read voltages VA to VG, the first shift patterns are not stored for each block, but a first predetermined number of candidates for the first shift patterns are determined in advance, and first identification information (hereinafter, also referred to as a first index) is determined indicating a candidate (among the first shift patterns) which is to be used for each block. The read voltage information 36 includes data pairings of the first predetermined number of first shift patterns and the first index, and data pairings of the blocks and the first index.

Before the shipment of the memory system 12, the stresses associated with as the program disturb, the read disturb, or the data retention time can be applied to the NAND memory 40, and the change of the threshold voltage of the memory cells MT is estimated for each block. The threshold voltage is estimated based on an error of read data when a read is executed with a certain read voltage (a ratio between a proportion of erroneously reading "0" as "1" and a proportion of erroneously reading "1" as "0"). For example, when the proportion of erroneously reading "0" as "1" is larger than the proportion of erroneously reading "1" as "0", it may be estimated that the threshold voltage is shifted in the negative direction. When the threshold voltage is shifted in the negative direction, the appropriate values VAs to VGs are shifted in the negative direction. When the threshold voltage is shifted in the positive direction, the appropriate values VAs to VGs are shifted in the positive direction.

There are various stresses, and the occurrence probability of each stress differs. A first predetermined number of appropriate value patterns are determined from an estimation result of the threshold voltage when a first predetermined number of stresses with a relatively high occurrence probability occur. The first predetermined number of first shift patterns are determined, which are the first differences between the respective appropriate values VAs to VGs included in the first predetermined number of appropriate value patterns and the respective default values VA0 to VG0 included in the default value patterns.

Assuming that the first predetermined number of the first shift patterns is 256, the first shift patterns may be specified by the first index of 8 bits (i.e., 1 byte). When the first shift patterns themselves are stored, the memory size of 7 bytes may be provided for each block. However, when the first index of the 256 first shift patterns is stored, the memory size per block may be reduced to 1 byte.

Since the first shift patterns represent the differences between the first predetermined number of appropriate value patterns and the default value patterns, the first shift patterns do not cope with all possible changes of the threshold voltage. Accordingly, there may be a block in which the first read voltage values VA1 to VG1, which are the sums of the default values VA0 to VG0 and the first shift values SA1 to SG1, do not reach the particular appropriate values VAs to VGs. When a read is executed for such a block with the read voltages VA to VG corresponding to the first read voltage values VA1 to VG1, a read error may thus occur.

In order to cope with such a block, the memory controller 20 manages second differences SA2 (SA2=VAs−VA1), SB2 (SB2=VBs−VB1), SC2 (SC2=VCs−VC1), SD2 (SD2=VDs−VD1), SE2 (SE2=VEs−VE1), SF2 (SF2=VFs−VF1), and SG2 (SG2=VGs−VG1) between the appropriate values VAs to VGs and the first read voltage values VA1 to VG1. The second differences SA2 to SG2 represent how much the first read voltage values VA1 to VG1 need to be additionally shifted to reach the appropriate values VAs to VGs, and will be referred to as second shift values. The vectors based on the second shift values SA2 to SG2 will be referred to as second shift patterns. The second shift values SA2 to SG2 are information used for obtaining the appropriate values VAs to VGs, and information related to the read voltages. Managing the second shift values SA2 to SG2 specifically indicates storing the second shift values SA2 to SG2 as the read voltage information 36 in the RAM 24 or as the read voltage information 38 in the NAND memory 40.

The memory controller 20 transmits second read voltage values VA2 (VA2=VA1+SA2), VB2 (VB2=VB1+SB2), VC2 (VC2=VC1+SC2), VD2 (VD2=VD1+SD2), VE2 (VE2=VE1+SE2), VF2 (VF2=VF1+SF2), and VG2 (VG2=VG1+SG2), which are the sums of the first read voltage values VA1 to VG1 and the second shift values SA2 to SG2, to the NAND memory 40. The NAND memory 40 generates the read voltages VA to VG corresponding to the second read voltage values VA2 to VG2, and applies the generated read voltages to the memory cell MT.

Similar to the first shift patterns, in order to reduce the size of the memory that stores the values of the read voltages VA to VG, the second shift patterns are not stored for each block, but rather a second predetermined number of second shift patterns are determined in advance, and second identification information (hereinafter, also referred to as a second index) is determined indicating second shift patterns which are to be used for each block. The read voltage information 36 includes data pairings of the second predetermined number of second shift patterns and the second index, and data pairings of the blocks and the second index.

The second predetermined number of second shift patterns are values in which the second read voltage values VA2 to VG2 obtained by further shifting the first read voltage values VA1 to VG1 to become the appropriate values VAs to VGs, or values in which the differences between the second read voltage values VA2 to VG2 and the appropriate values VAs to VGs are the smallest.

Most of the first shift patterns have the Euclidean distance of about 3, and about 50% of the entire first shift patterns have the Euclidean distance of 3 or less. This indicates that the Euclidean distance for further shifting the first read voltage values VA1 to VG1 using the second shift patterns may be about 3, and the number of second shift patterns may be smaller than the number of first shift patterns.

Even when the first read voltage values VA1 to VG1 obtained by using the first shift patterns are not the appropriate values VAs to VGs, the first read voltage values VA1 to VG1 can be shifted using the second shift patterns, so that the occurrence of read error may be reduced, and the read performance may be improved.

Figure 5:
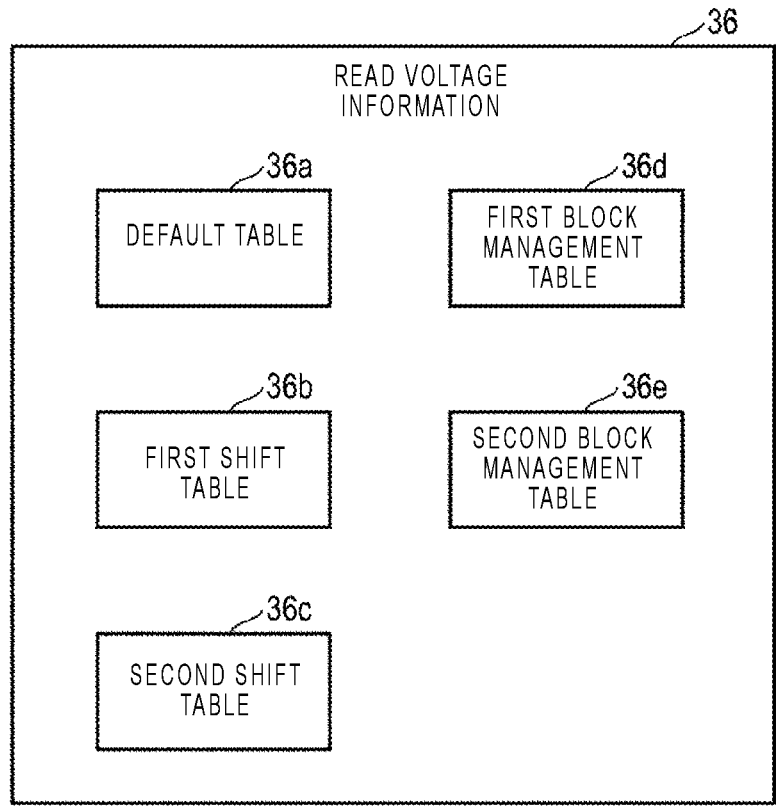
FIG. 5 is a diagram illustrating an example of read voltage information stored in a RAM.

FIG. 5 illustrates an example of the read voltage information 36 stored in the RAM 24. The read voltage information 36 includes a default table 36*a*, a first shift table 36*b*, a second shift table 36*c*, a first block management table 36*d*, and a second block management table 36*e*.

FIG. 6 illustrates an example of the default table 36*a*. The default table 36*a* stores the default values VA0 to VG0. When the memory cell MT operates in the TLC mode, the default table 36*a* stores the default values VA0 to VG0 for the seven read voltages VA to VG, respectively. Before the shipment of the memory system 12, a manufacturer examines the threshold voltage of the memory cells MT, and the default values VA0 to VG0 are determined from the threshold voltages.

FIG. 7 illustrates an example of the first shift table 36*b*. The first shift table 36*b* includes a first predetermined number of entries (256 entries in this example). Each entry stores a first shift pattern and a first index that is identification information for the first shift pattern. The 256 first shift patterns are identified by the first index of 8 bits. In FIG. 7, the first index and the first shift values SA1 to SG1 are represented by decimal numbers for convenience.

In the first shift patterns with the first index of 0, all of the first shift values SA1 to SG1 are 0, and the appropriate values VAs to VGs are thus the same as the default values VA0 to VG0. In this case, the default values VA0 to VG0 may be set as the read voltage values.

The first shift patterns with the first index of 1 include the first shift value SA1 having a value of 0, the first shift value SB1 having a value of 1, the first shift values SC1 and SD1 having a value of −1, and the first shift values SE1, SF1, and SG1 having a value of 0. The first shift patterns with the first index of 255 include the first shift value SA1 having a value of 2, the first shift value SB1 having a value of −5, the first shift value SC1 having a value of −7, and the first shift value SD1 having a value of −10, the first shift value SE1 having a value of −12, the first shift value SF1 having a value of −14, and the first shift value SG1 having a value of −17.

When the difference patterns (which are the differences between the appropriate value patterns that have changed with the change of the threshold voltages and the default value patterns) are equal to any of the first shift patterns, the sums VA1 to VG1 of the first shift values SA1 to SG1 of the first shift patterns equal to the difference patterns and the default values VA0 to VG0 may be set as the read voltage values, so that the read voltage values become the changed appropriate values VAs to VGs. When the difference patterns are not equal to any of the first shift patterns, the sums VA1 to VG1 of the first shift values of the first shift patterns having values most similar or close to the difference patterns and the default values VA0 to VG0 may be set as the read voltage values, so that the read voltage values become close to the changed appropriate values VAs to VGs. Whether patterns are matched and whether the patterns are similar are determined using any distance scale such as the Hamming distance, the Euclidean distance (also called norm) or the like.

Before the shipment of the memory system 12, the manufacturer applies various stresses, such as the program disturb, the read disturb, and the data retention time to the NAND memory 40, to estimate a first predetermined number of change patterns for the threshold voltage of the memory cells MT. The first predetermined number of first shift patterns are determined corresponding to the estimated change patterns of the threshold voltage. The first predetermined number of first shift patterns are stored as the first shift table 36b.

The first index of the first shift patterns is determined according to the order of stress intensity. For example, the first index of the first shift patterns corresponding to the change patterns of the threshold voltage for the weakest stress is 1, and the value of the first index increases as the stress intensity increases, such that the first index of the first shift patterns corresponding to the change patterns of the threshold voltage for the strongest stress is 255 (maximum value).

Figures 8, 9:
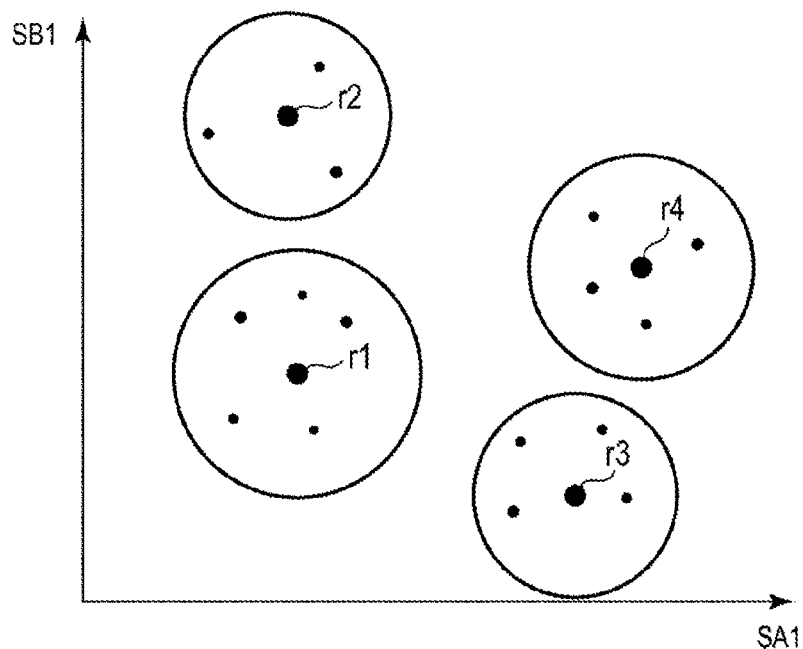
FIG. 8 is a diagram illustrating an example of a second shift table.
FIG. 9 is a diagram illustrating aspects related to first shift patterns.

FIG. 8 illustrates an example of the second shift table 36c. The second shift table 36c includes a second predetermined number of entries (32 entries in this example). Each entry stores a second shift pattern and a second index that is identification information of the second shift pattern. The 32 second shift patterns are identified by the second index of 5 bits. In FIG. 8, the second index and the second shift values SA2 to SG2 are represented by decimal numbers for convenience.

The second shift patterns with the second index of 0 include the second shift values SA2 and SB2 having a value of −1, the second shift value SC2 having a value of 1, and the second shift values SD2, SE2, SF2, and SG2 having a value of 2. The second shift patterns with the second index of 31 include the second shift value SA2 having a value of 0, the second shift value SB2 having a value of −3, the second shift value SC2 having a value of −5, the second shift value SD2 having a value of −8, the second shift value SE2 having a value of −10, the second shift value SF2 having a value of −12, and the second shift value SG2 having a value of −15.

When the difference patterns between the appropriate value patterns that have changed with the change of the threshold voltage and the first voltage value patterns that are the first read voltage values VA1 to VG1 are equal to any of the second shift patterns, the second read voltage values VA2 to VG2 which are the sums of the second shift values SA2 to SG2 of the second shift patterns equal to the difference patterns and the first read voltage values VA1 to VG1 may be set as the read voltage values, so that the read voltage values become the changed appropriate values VAs to VGs. When the difference patterns are not equal to any of the second shift patterns, the second read voltage values VA2 to VG2 (which are the sums of the second shift values of the second shift patterns having values most similar or close to the difference patterns and the first read voltage value VA1 to VG1) may be set as the read voltage values, so that the read voltage values become close to the changed appropriate values VAs to VGs. Whether patterns are matched and whether the patterns are similar are determined using any distance scale such as the Hamming distance, the Euclidean distance or the like.

Examples of the method of generating the second shift table 36c include (1) a method of generating the table from data, (2) a regularly generating method, (3) a randomly generating method, and (4) a randomly generating method in which a weighting is used.

As for the method (1), the second predetermined number of second shift patterns are generated from a large number of first shift patterns determined based on the estimation result of the threshold voltage of the memory cell MT when the various stresses are applied to the NAND memory 40. FIG. 9 is a diagram illustrating the concept of the first shift patterns when the read voltage patterns are two-dimensional vectors (based on the voltages VA and VB). The origin of the coordinate system corresponds to the appropriate value. The large number of points represent the large number of first shift patterns (SA1 and SB1). The number of dimensions of the coordinate system in FIG. 9 is equal to the number of dimensions of the read voltage patterns.

By performing a clustering process such as K-means or the like on the large number of points representing the large number of first shift patterns, the large number of points may be converted into a relatively small number of representative points r1, r2, r3, and r4. The number of representative points r1, r2, r3, and r4 is the second predetermined number of second shift patterns. The second shift patterns represented by the representative points r1, r2, r3, and r4 are generated for shifting the first read voltage values VA1 to VG1 obtained by the first shift patterns to the appropriate values VAs to VGs.

As for the method (2), in the coordinate system representing the first shift patterns as points, grid points located in the distance less than a threshold value from the origin and having equal intervals are selected. The Euclidean distance may be used as the distance. When the Euclidean distance for most of the first shift patterns is about 3, the example of the threshold value may be 3.2. The second shift patterns are generated for shifting the first read voltage values VA1 to VG1 obtained by the first shift patterns corresponding to the selected grid points, to the appropriate values VAs to VGs. Assuming that the read voltage patterns are two-dimensional vectors (based on the voltages VA and VB), grid points with a constant grid interval are selected among grid points closer to the origin than a point (x1, y1) in the coordinate system illustrated in FIG. 9. The x1 and y1 are the threshold value. In the method (2) as well, the number of second shift patterns is smaller than the number of first shift patterns.

As for the method (3), in the coordinate system representing the first shift patterns as points, a second predetermined number of grid points are randomly selected from the grid points located in the distance less than the threshold value from the origin. The second shift patterns are generated for shifting the first read voltage values VA1 to VG1 obtained by the first shift patterns corresponding to the selected grid points, to the appropriate values VAs to VGs. In the method (3) as well, the number of second shift patterns is smaller than the number of first shift patterns.

As for the method (4), the FBC when a read is executed by applying the first read voltages obtained by using the first shift patterns is estimated. The second shift patterns are generated for shifting the first read voltage values VA1 to VG1 obtained by the first shift patterns in which the FBC of the estimation result is larger than a threshold value to the appropriate values VAs to VGs. As the threshold value of the FBC can be large, the required number of second shift patterns is reduced. Thus, in the method (4) as well, the number of second shift patterns is smaller than the number of first shift patterns.

FIG. 10 illustrates an example of the first block management table 36d. The first block management table 36d includes the same number of entries as the number of blocks in the device. Each entry stores a block address and a first index of first shift patterns used for obtaining the read voltage values of the block identified by the block address. The first block management table 36d of FIG. 10 indicates that for the blocks having the block addresses of 2 and 3, the values to be added to the default values VA0 to VG0 for obtaining the read voltage values are the first shift values SA1 to SG1 of the first shift patterns with the first index of 9. The first block management table 36d of FIG. 10 indicates that the blocks having the block addresses of 0 and 1 have the first index of 0 (indicating the first shift patterns in which all of the first shift values are 0). Thus, for the blocks having the block addresses of 0 and 1, the default values VA0 to VG0 are to be set the read voltage values.

FIG. 11 illustrates an example of the second block management table 36e. The second block management table 36e includes the same number of entries as the number of blocks in the device. Each entry stores a block address and a second index of second shift patterns used for obtaining the read voltage values of the block identified by the block address. The second block management table 36e of FIG. 11 indicates that for the block having the block address of 1, the values for obtaining the read voltage values, to be added to the first read voltage values VA1 to VG1 of each block obtained by using the first shift patterns are the second shift values SA2 to SG2 of the second shift patterns with the second index of 1. The second block management table 36e of FIG. 11 indicates that for the block of which the second index is blank (none) (the block having the block address of 0), the first read voltage values VA1 to VG1 are the appropriate values VAs to VGs, and the first read voltages VA1 to VG1 is to be set as the second read voltages VA2 to VG2. That is, the block of which the second index is blank (none) is a block for which the first voltage value patterns obtained by using the first shift patterns do not need to be further shifted with the second shift patterns.

During a read, the memory controller 20 reads the default values VA0 to VG0 from the default table 36a, reads the first index of the read target (selected) block from the first block management table 36d, reads the first shift patterns of the read target block according to the first index from the first shift table 36b, and adds the default values VA0 to VG0 and the first shift values SA1 to SG1, so as to obtain the first read voltage values VA1 to VG1. Further, the memory controller 20 also reads the second index of the read target block from the second block management table 36e. When the second index is a value other than blank, the memory controller 20 reads the second shift patterns of the read target block according to the second index from the second shift table 36c, and adds the first read voltage values VA1 to VG1 and the second shift values SA2 to SG2, so as to obtain the second read voltage values VA2 to VG2.

When the read voltages of the second read voltage values VA2 to VG2 are used, the read error does not occur or hardly occurs. However, when the threshold voltage of the memory cell MT changes, a read error may occur. When a read error occurs, the first shift patterns and the second shift patterns which are used may be changed when the second read voltage values VA2 to VG2 of each block are obtained.

Figure 12:
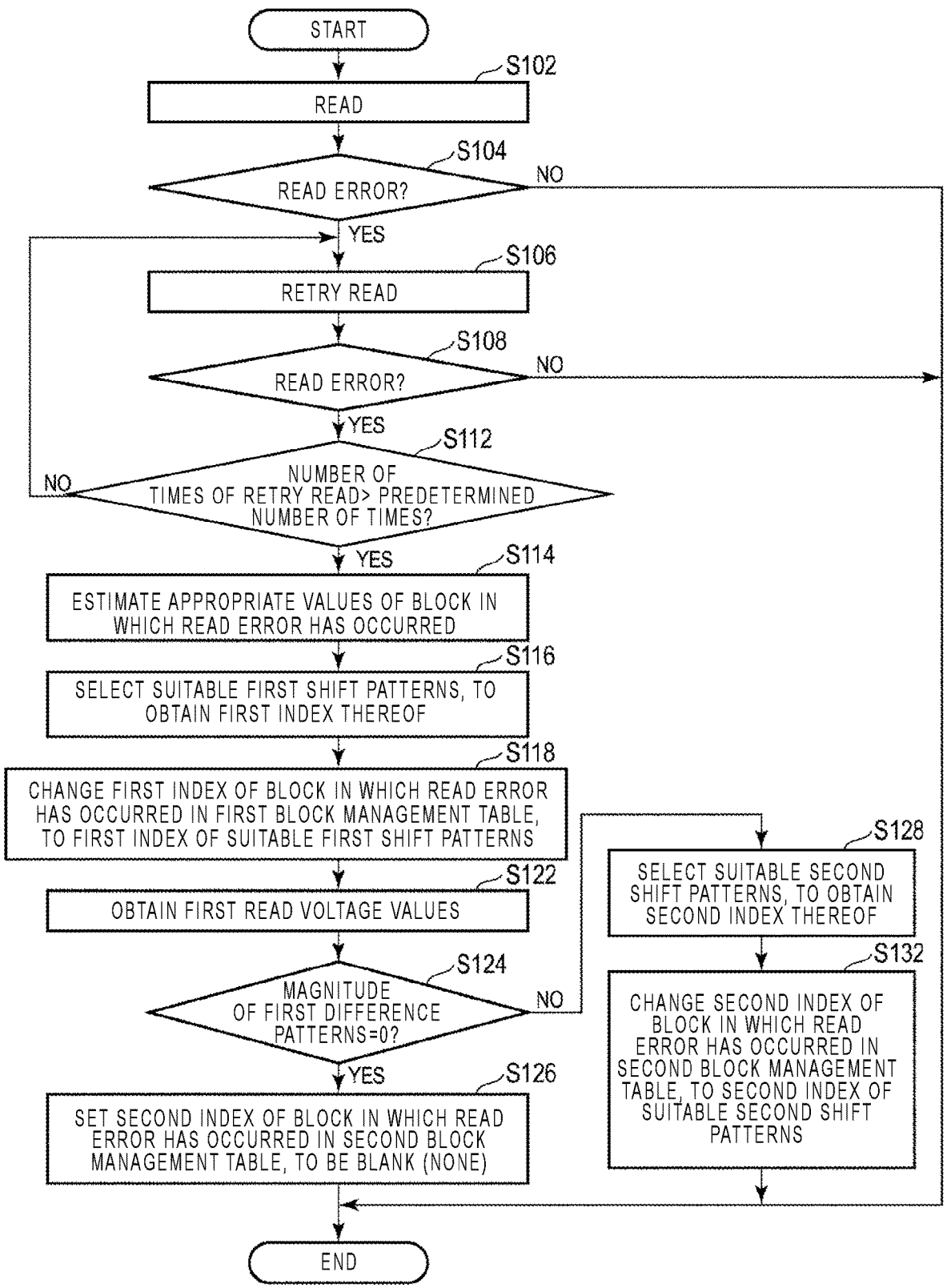
FIG. 12 is a flowchart illustrating an example of an update of a first block management table and a second block management table.

FIG. 12 is a flowchart illustrating an example of a process of changing the first shift patterns and the second shift patterns used when the second read voltage values VA2 to VG2 of each block are obtained by the memory controller 20 according to the first embodiment.

The memory controller 20 executes a read process of reading data from at least one read target memory cell MT (S102). The memory controller 20 may execute the read process in response to a read command from the host device 14, or may voluntarily execute the read process.

Figure 13:
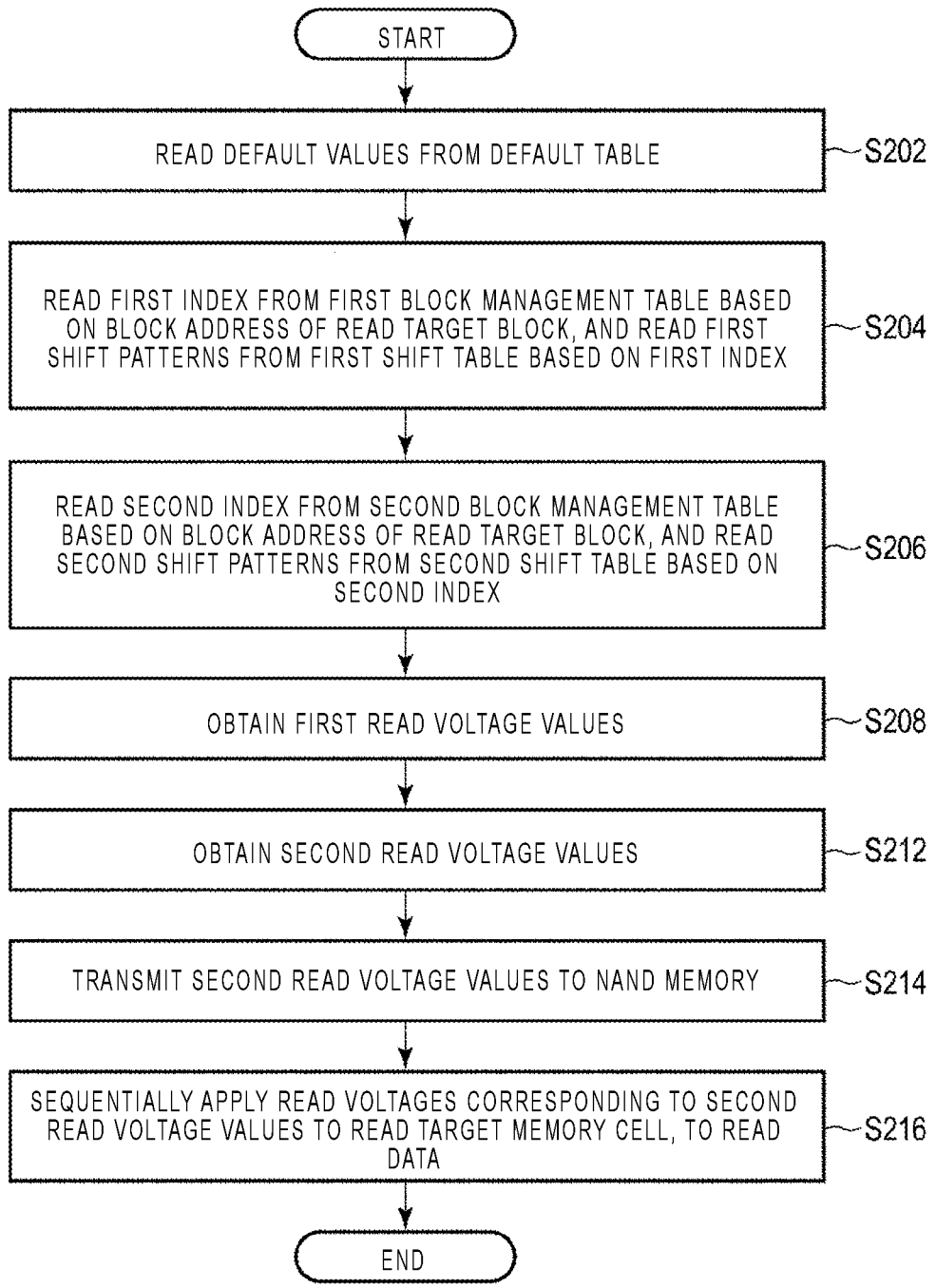
FIG. 13 is a flowchart illustrating an example of a read.

FIG. 13 is a flowchart illustrating an example of the details of the read process (S102) of FIG. 12.

The memory controller 20 reads the default values VA0 to VG0 from the default table 36a (S202).

The memory controller 20 reads the first index from the first block management table 36d based on the block address of the block including the one read target memory cell MT, and reads the first shift patterns from the first shift table 36b based on the first index (S204).

The memory controller 20 reads the second index from the second block management table 36e based on the block address of the block including the one read target memory cell MT, and reads the second shift patterns from the second shift table 36c based on the second index (S206).

The memory controller 20 adds the default values VA0 to VG0 and the first shift values SA1 to SG1 of the first shift patterns to obtain the first read voltage values VA1 to VG1 (S208).

The memory controller 20 adds the first read voltage values VA1 to VG1 and the second shift values SA2 to SG2 of the second shift patterns to obtain the second read voltage values VA2 to VG2. When the second index of the read target block is blank, the memory controller 20 does not add the first read voltage values VA1 to VG1 and the second shift values of the second shift patterns, and sets the first read voltage values VA1 to VA1 as the second read voltage values VA2 to VG2 (S212). When the second index of the read target block is blank, the second shift values are 0. Thus, the memory controller 20 may add the first read voltage values VA1 to VG1 and the second shift values of the second shift patterns.

The memory controller 20 transmits the second read voltage values VA2 to VG2 to the NAND memory 40 (S214).

The row decoder 119 in the NAND memory 40 sequentially applies the read voltages VA to VG corresponding to the second read voltage values VA2 to VG2 transmitted from the memory controller 20 to the read target memory cell MT, so as to read the data (S216). After S216, the read process (S102) of FIG. 12 ends.

Referring back to the descriptions of FIG. 12, after the read process (S102), the memory controller 20 determines whether a read error has occurred (S104). When it is determined that no read error has occurred (NO in S104), the process ends.

When it is determined that a read error has occurred (YES in S104), the memory controller 20 increments the first index of the first shift patterns of the first shift table 36b used for the read in S102, by +1, to change the first shift patterns, and executes a retry read process for reading the data again (S106). In S106, the memory controller 20 sets the second index of the second shift patterns to 0.

After the retry read process is executed, the memory controller 20 again determines whether a read error has occurred (S108). When it is determined that no read error has occurred (NO in S108), the process ends.

When it is determined that a read error has occurred (YES in S108), the memory controller 20 determines whether the number of times of the retry read is equal to or more than a threshold value (S112). When it is determined that the number of times of the retry read is not equal to or more than the threshold value (NO in S112), the memory controller 20 executes the retry read process again (S106).

When it is determined that the number of times of the retry read is equal to or more than the threshold value (YES in S112), the memory controller 20 estimates the appropriate values VAs to VGs for the block in which the read error has occurred (S114). An example of the estimation method is a tracking read. The tracking read executes a read multiple times while changing the values of the read voltages VA2 to VG2 by a predetermined value within a settable range, and estimates the appropriate values VAs to VGs based on the results of the read executed multiple times. The predetermined value is, for example, +1 DAC, −1 DAC, +2 DAC, or the like. As the results of the read, the number of FBCs may be determined. Further, the total number of cells that have a specific value (e.g., 1) for each read voltage may be counted, and the appropriate values of the read voltages may be estimated assuming that a location with the smallest change (small slope) is the minimum value (valley). Further, the appropriate values of the read voltages may be estimated by obtaining a valley by an approximate curve obtained from the total values of respective cells of read voltages of several points.

The memory controller 20 selects the first shift patterns suitable for obtaining the estimated appropriate values VAs to VGs from the first shift patterns of the first shift table 36b, and obtains the first index of the selected suitable first shift patterns (S116).

The suitable first shift patterns are the first shift patterns that match the first difference patterns which are the first differences (VAs−VA0, VBs−VB0, VCs−VC0, VDs−VD0, VEs−VE0, VFs−VF0, and VGs−VG0) between the estimated appropriate values VAs to VGs and the default values VA0 to VG0. When there are no first shift patterns that match the first difference patterns, the suitable first shift patterns are the first shift patterns that have values most similar or close to the first difference patterns. When the suitable first shift patterns match the first difference patterns, the sums of the first shift values SA1 to SG1 of the suitable first shift patterns and the default values VA0 to VG0 are the estimated appropriate values VAs to VGs. When the suitable first shift patterns are the first shift patterns that have values most similar or close to the first difference patterns, the sums of the first shift values SA1 to SG1 of the first shift patterns and the default values VA0 to VG0 are the values close to the appropriate values VAs to VGs.

The memory controller 20 changes the first index of the block in which the read error has occurred in the first block management table 36d, to the first index of the suitable first shift patterns obtained in S116 (S118).

The memory controller 20 adds the default values VA0 to VG0 and the first shift values SA1 to SG1 of the suitable first shift patterns determined in S116, to obtain the first read voltage values VA1(VA1=VA0+SA1) to VG1 (VG1=VG0+SG1) of the block in which the read error has occurred (S122).

The memory controller 20 determines whether the magnitude of the first difference patterns obtained in S116 is 0 (S124).

When it is determined that the magnitude of the first difference patterns is 0 (YES in S124), the memory controller 20 sets the second index of the block in which the read error has occurred in the second block management table 36e, to be blank (none) (S126). After S126, the process ends.

When it is determined that the magnitude of the first difference patterns is not 0 (NO in S124), the memory controller 20 selects suitable second shift patterns from the second shift patterns of the second shift table 36c, and obtains the second index of the selected suitable second shift patterns (S128).

The suitable second shift patterns are the second shift patterns that match the second difference patterns which are the second differences (VAs−VA1, VBs−VB1, VCs−VC1, VDs−VD1, VEs−VE1, VFs−VF1, and VGs−VG1) between the estimated appropriate values VAs to VGs and the first read voltage values VA1 to VG1 obtained in S122. When it is determined that there are no second shift patterns that match the second difference patterns, the suitable second shift patterns are the second shift patterns that have values most similar or close to the second difference patterns. When it is determined that the suitable second shift patterns match the second difference patterns, the sums of the second shift values SA2 to SG2 of the suitable second shift patterns and the first read voltage values VA1 to VG1 are the estimated appropriate value VAs to VGs. When the suitable second shift patterns are the second shift patterns having values most similar or close to the second difference patterns, the sums of the second shift values SA2 to SG2 of the suitable second shift patterns and the first read voltage values VA1 to VG1 are values close to the appropriate values VAs to VGs.

The memory controller 20 changes the second index of the block in which the read error has occurred in the second block management table 36e to the second index of the suitable second shift patterns obtained in S128 (S132). After S132, the process ends.

Through the process of FIG. 12, when the threshold voltage of the memory cell MT changes, and thus the appropriate values VAs to VGs of the read voltages change, the first block management table 36d stores the first index of the first shift patterns such that the default values VA0 to VG0 may be changed to the appropriate values VAs to VGs. The second block management table 36e stores the second index of the second shift patterns such that when an error still occurs in changing the default values VA0 to VG0 to the appropriate values VAs to VGs by use of the first shift patterns, the error may be made be 0 or reduced by another adjustment. Thus, even when the threshold voltage of the memory cell MT changes, the appropriate read voltages may be applied to the memory cell MT, so that fewer read error occurs, and the memory system capable of improving the read performance may be provided.

In the process of FIG. 12, when the number of times of the retry read for the read target block is equal to or more than the threshold value, the first index of the first block management table 36d and the second index of the second block management table 36e are updated for the read target block. However, without being limited thereto, the appropriate values VAs to VGs of all the blocks may be periodically estimated, and the first index of the first block management table 36d and the second index of the second block management table 36e may be periodically updated for the blocks for which the appropriate values VAs to VGs have been estimated.

Second Embodiment

In the first embodiment, the first shift table 36b and the second shift table 36c are generated before the shipment of the memory system 12, and are not changed after the shipment. In a second embodiment, the first shift table 36b is the same as that in the first embodiment, but the second shift table 36c is generated and updated during the use by a user after the shipment. Here, it is assumed that the second shift table 36c having a blank entry exists at the time of shipment. However, the second shift table 36c may not exist at the time of shipment and may thus be created subsequently.

Figure 14:
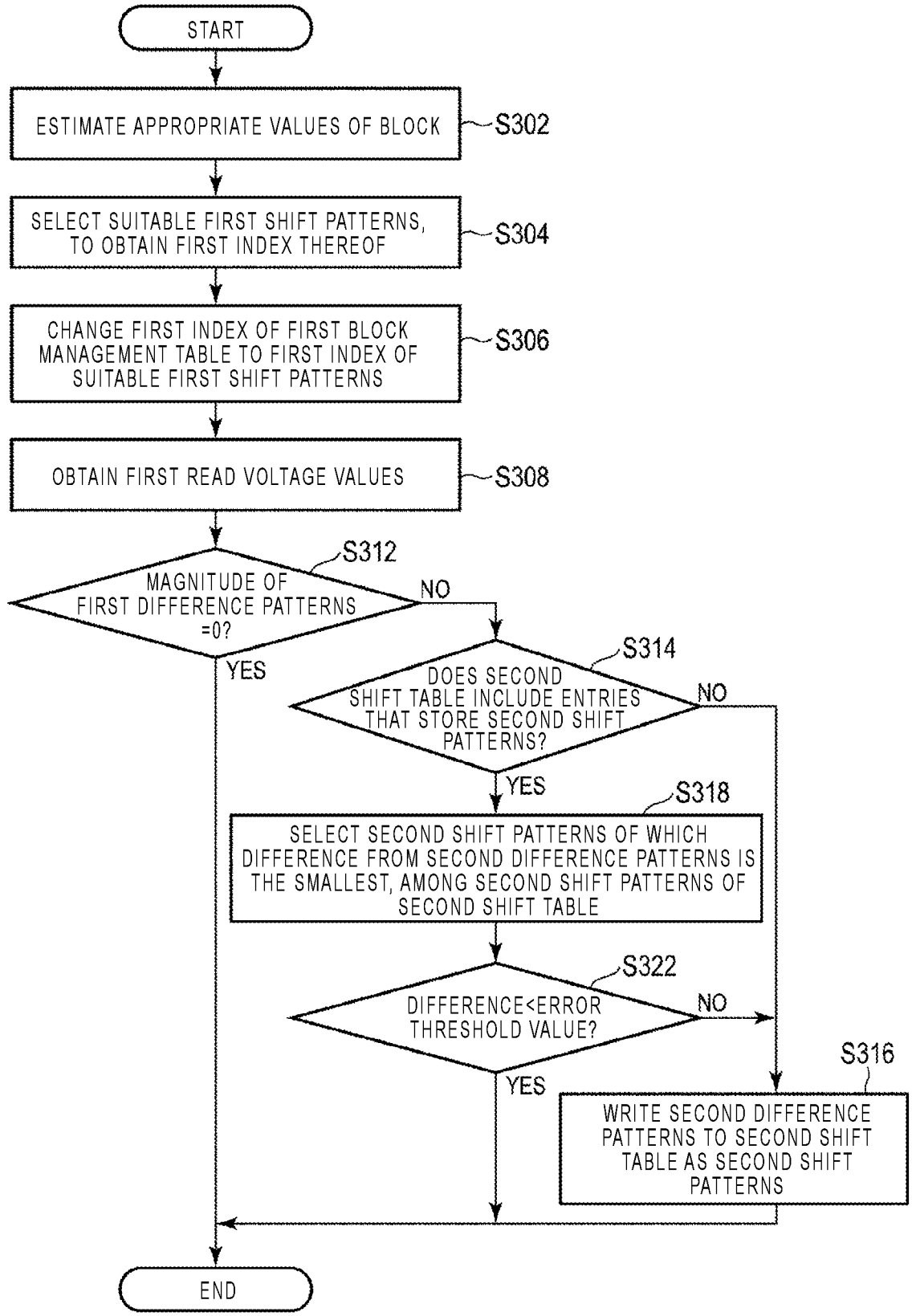
FIG. 14 is a flowchart illustrating an example of generation and update of a second shift table according to a second embodiment.

FIG. 14 is a flowchart illustrating an example of the generation and update process of the second shift table 36c by the memory controller 20 according to the second embodiment. The process of FIG. 14 is performed for each block. In general, the processes of S302 to S312 in FIG. 14 are the same as the processes of S114 to S124 in FIG. 12 as described for the first embodiment.

The memory controller 20 estimates the appropriate values VAs to VGs of a certain block (S302). The process of estimating the appropriate values VAs to VGs is the same as the process of S114 of FIG. 12 described in the first embodiment.

The memory controller 20 selects the first shift patterns suitable for obtaining the estimated appropriate values VAs to VGs, from the first shift patterns of the first shift table 36b, and obtains the first index of the selected suitable first shift patterns (S304). The process of S304 is the same as the process of S116 of FIG. 12. That is, the memory controller 20 selects the first shift patterns that match the first difference patterns which are the differences between the estimated appropriate value patterns and the default value patterns, or the first shift patterns that have values most similar or closest to the first difference patterns, as the suitable first shift patterns.

As in the process of S118 of FIG. 12, the memory controller 20 changes the first index of the first block management table 36d to the first index of the suitable first shift patterns (S306).

As in the process of S122 of FIG. 12, the memory controller 20 obtains the first read voltage values VA1 to VG1 (S308).

The memory controller 20 determines whether the magnitude of the first difference patterns is 0 (S312). The process of S312 is the same as the process of S124 of the first embodiment.

When it is determined that the magnitude of the first difference patterns is 0 (YES in S312), the second shift table 36c does not need to be generated and updated, and thus, the process ends.

When it is determined that the magnitude of the first difference patterns is not 0 (NO in S312), the memory controller 20 next determines whether the second shift table 36c includes entries that store the second shift patterns (S314).

When it is determined that the second shift table 36c does not include entries that store the second shift patterns (NO in S314), the memory controller 20 writes the second difference patterns, which are the second differences between the appropriate values VAs to VGs and the first read voltage values VA1 to VG1, as the second shift patterns to the second shift table 36c (S316). After S316, the process ends.

When it is determined that the second shift table 36c includes entries that store the second shift patterns (YES in S314), the memory controller 20 selects the second shift patterns for which the difference from the second difference patterns is the smallest from the second shift patterns of the second shift table 36c (S318).

The memory controller 20 determines whether the difference is equal to or less than an error threshold value (S322).

When it is determined that the difference is not equal to or less than the error threshold value (NO in S322), the memory controller 20 writes the second difference patterns to the second shift table 36c as the second shift patterns (S316).

When it is determined that the difference is equal to or less than the error threshold value (YES in S322), the second shift table 36c does not need to be generated and updated, and thus, the process ends.

By performing the determination of S322, the number of second difference patterns to be written to the second shift table 36c may be limited to some extent. That is, the second difference patterns for which the difference from the second shift patterns of the second shift table 36c is not equal to or less than the error threshold value are written to the second shift table 36c, and the second difference patterns for which the difference is equal to or less than the error threshold value are not written. Other criteria may be applied for determining the write/non-write. For example, the second difference patterns of a block having the small FBC may not be written to the second shift table 36c. Since it takes time to decode a block having a deep decode stage (e.g., a high number of errors), the read may be executed based on a more appropriate threshold voltage, thereby reducing the FBC. Thus, whether to write the second difference patterns to the second shift table 36c may be determined based on the depth of the decode stage.

Through the process of FIG. 14, when the appropriate values VAs to VGs of the read voltages of the memory cell MT change so that an error occurs when the default values VA0 to VG0 are changed to the appropriate values VAs to VGs using the first shift patterns, the second shift patterns for making the error be 0 or reducing the error may be written to the second shift table 36c. Thus, according to the second embodiment, it is possible to provide the memory system 12 which may reduce the occurrence probability of read error, and thus, improve the read performance.

In the process of FIG. 14, the upper limit for the number of second shift patterns to be written to the second shift table 36c is not limited. Thus, the memory size of the second shift table 36c may increase infinitely. In order to prevent the increase, the memory size of the second shift table 36c may be restricted. In this case, the number of second shift patterns to be written to the second shift table 36c may be restricted, and when the second shift table 36c has no capacity to write new second shift patterns, the written second shift patterns need to be deleted.

As for a method of selecting the second shift patterns to be deleted, there is a method of deleting the second shift patterns in an order from the earliest written second shift patterns. This method may be easily implemented by configuring the second shift table 36c using a memory having the FIFO structure. This method may also be implemented by configuring the second shift table 36c using a memory having a cache structure.

Alternatively, the second shift patterns may be deleted in an ascending order of the number of use times instead of the time at which the patterns were written. To this end, the number of use times of the second shift patterns may be counted (tracked), and a table that tracks the number of use times of the second shift patterns may be provided.

When the second shift patterns are to be deleted, flags may be added to the second shift table 36c to indicate patterns that may be deleted and patterns that may not be deleted instead of simply deleting all the second shift patterns that satisfy one of the deletion conditions described above. The flags can be set by a user when the second shift patterns are written to the second shift table 36c.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
a plurality of nonvolatile memory cells each capable of storing data; and
a controller configured to set a read voltage for reading the data stored in the plurality of nonvolatile memory cells, wherein
each of the plurality of nonvolatile memory cells belongs to one of a plurality of memory cell groups;
the controller is configured to manage:
a plurality of first shift patterns for values of a plurality of read voltages,
first index information associating one first shift pattern among the plurality of first shift patterns to each memory cell group among the plurality of memory cell groups,
a plurality of second shift patterns for difference values indicating a difference between the values of the plurality of read voltages and values of a plurality of first read voltages set according to a first shift pattern, and
second index information associating one second shift pattern among the plurality of second shift patterns to each memory cell group among the plurality of memory cell groups;
the total number of the second shift patterns is smaller than the total number of the first shift patterns; and
the controller is further configured to:
select one first shift pattern from the plurality of first shift patterns based on the first index information for a read target memory cell group among the plurality of memory cell groups,
select one second shift pattern from the plurality of second shift patterns based on the second index information for the read target memory cell group, and
generate read voltages for the read target memory cell group based on the selected first shift pattern and the selected second shift pattern.

2. The memory system according to claim 1, wherein the controller selects the first shift pattern based on an estimation of a change in a threshold voltage of the nonvolatile memory cells.

3. The memory system according to claim 2, wherein the estimation of the change in the threshold voltage occurs after a read failure of the read target memory cell group.

4. The memory system according to claim 1, wherein the first shift patterns indicate differences from initial values of the plurality of read voltages.

5. The memory system according to claim 4, wherein the initial values are default values stored by the memory system in the plurality of nonvolatile memory cells at the time of shipment.

6. The memory system according to claim 1, wherein each memory cell group is a block unit.

7. The memory system according to claim 1, wherein the nonvolatile memory cells are NAND flash memory cells.

8. The memory system according to claim 1, wherein
the plurality of first shift patterns and the plurality of second shift patterns are stored in tables which the controller cannot overwrite or alter, and
the first index information and the second index information are stored in tables which the controller can overwrite and alter.

9. The memory system according to claim 1, wherein the controller is configured to:
manage the plurality of first shift patterns and the plurality of second shift patterns as non-rewritable information, and
manage the first index information and the second index information as rewritable information.

10. The memory system according to claim 1, wherein the controller is configured to:
manage the plurality of first shift patterns as non-rewritable information, and
manage the plurality of second shift patterns, the first index information, and the second index information as rewritable information.

11. The memory system according to claim 10, wherein the total number of the plurality of second shift patterns that can be stored is limited to a predetermined number, and the controller is configured to overwrite a previously stored second shift pattern with a new second shift pattern after the stored number of second shift patterns reaches the predetermined number.

12. The memory system according to claim 11, wherein the controller is configured to select the previously stored second shift pattern to be overwritten based on a tracked number of uses for each of the second shift patterns in the plurality of second shift patterns.

13. The memory system according to claim 1, wherein
each of the nonvolatile memory cells is capable of storing multi-bit data,
the controller sets a plurality of read voltages for reading the multi-bit data.

14. A read method for a memory system with a plurality of nonvolatile memory cells, the method comprising:
managing a plurality of first shift patterns for values of a plurality of read voltages;
managing first index information associating one first shift pattern among the plurality of first shift patterns to each memory cell group among a plurality of memory cell groups into which the plurality of nonvolatile memory cells are divided;
managing a plurality of second shift patterns for difference values indicating a difference between the values of the plurality of read voltages and values of a plurality of first read voltages set according to a first shift pattern;
managing second index information associating one second shift pattern among the plurality of second shift patterns to each memory cell group among the plurality of memory cell groups;
selecting one first shift pattern from the plurality of first shift patterns based on the first index information for a read target memory cell group among the plurality of memory cell groups;
selecting one second shift pattern from the plurality of second shift patterns based on the second index information for the read target memory cell group; and generating read voltages for the read target memory cell group based on the selected first shift pattern and the selected second shift pattern, wherein the total number of the second shift patterns is smaller than the total number of the first shift patterns.

15. The method according to claim 14, wherein the first shift pattern is selected based on an estimation of a change in a threshold voltage of the nonvolatile memory cells.

16. The method according to claim 15, wherein the estimation of the change in the threshold voltage occurs after a read failure of the read target memory cell group.

17. The method according to claim 14, wherein the first shift patterns indicate differences from initial values of the plurality of read voltages.

18. The method according to claim 14, wherein the plurality of first shift patterns and the plurality of second shift patterns are managed as non-rewritable information, and the first index information and the second index information are managed as rewritable information.

19. The method according to claim 14, wherein the plurality of first shift patterns is managed as non-rewritable information, and the plurality of second shift patterns, the first index information, and the second index information are managed as rewritable data.

20. The method according to claim 14, wherein each of the nonvolatile memory cells is capable of storing multi-bit data, and a plurality of read voltages for reading the multi-bit data is set.

* * * * *